United States Patent
Sasaki

(10) Patent No.: US 10,633,761 B2
(45) Date of Patent: Apr. 28, 2020

(54) GA2O3-BASED SINGLE CRYSTAL SUBSTRATE, AND PRODUCTION METHOD THEREFOR

(71) Applicant: TAMURA CORPORATION, Nerima-ku, Tokyo (JP)

(72) Inventor: Kohei Sasaki, Tokyo (JP)

(73) Assignee: TAMURA CORPORATION, Nerima-ku, Tokyo (JP)

(*) Notice: Subject to any disclaimer, the term of this patent is extended or adjusted under 35 U.S.C. 154(b) by 0 days.

(21) Appl. No.: 16/171,591

(22) Filed: Oct. 26, 2018

(65) Prior Publication Data

US 2019/0062942 A1 Feb. 28, 2019

Related U.S. Application Data

(63) Continuation of application No. 14/772,885, filed as application No. PCT/JP2014/054695 on Feb. 26, 2014, now Pat. No. 10,161,058.

(30) Foreign Application Priority Data

Mar. 4, 2013 (JP) .................................. 2013-042043

(51) Int. Cl.
| | |
|---|---|
| C30B 29/16 | (2006.01) |
| C30B 31/00 | (2006.01) |
| C30B 13/10 | (2006.01) |
| C30B 13/24 | (2006.01) |
| C30B 13/30 | (2006.01) |
| C30B 13/32 | (2006.01) |

(52) U.S. Cl.
CPC .............. *C30B 13/10* (2013.01); *C30B 13/24* (2013.01); *C30B 13/30* (2013.01); *C30B 13/32* (2013.01); *C30B 29/16* (2013.01)

(58) Field of Classification Search
CPC ......... C30B 29/16; C30B 13/10; C30B 13/30; C30B 13/32; C30B 13/24; C30B 31/00
See application file for complete search history.

(56) References Cited

U.S. PATENT DOCUMENTS

| 8,638,440 B1 | 1/2014 | Ohodnicki, Jr. et al. |
| 2004/0255844 A1 | 12/2004 | Kaneko et al. |
| 2006/0150891 A1 | 7/2006 | Ichinose et al. |
| 2007/0166967 A1 | 7/2007 | Ichinose et al. |
| 2008/0265264 A1 | 10/2008 | Ichinose et al. |
| 2010/0229789 A1 | 9/2010 | Ichinose et al. |
| 2012/0304918 A1 | 12/2012 | Ichinose et al. |

FOREIGN PATENT DOCUMENTS

| CN | 1754013 A | 3/2006 |
| EP | 1 447 464 A1 | 8/2004 |
| EP | 1 598 450 A2 | 11/2005 |
| JP | 2005-235961 A | 9/2005 |
| JP | 2007-191365 A | 8/2007 |
| JP | 2009-29694 A | 2/2009 |
| JP | 2011-102235 A | 5/2011 |
| JP | 2011-176090 A | 9/2011 |
| JP | 2011-190127 A | 9/2011 |
| TW | 201135954 A | 10/2011 |
| WO | 2005/078812 A1 | 8/2005 |

OTHER PUBLICATIONS

Harwig T. et al., "The Ultraviolet Luminescence of β-Galliumsesquioxide", J. Phys. Chem. Solids 39:675-680 (Jan. 1, 1978).
Irmscher K. et al., "Electrical Properties of β-Ga2O3 Single Crystals Grown by the Czochralski Method", Journal of Applied Physics 110:063720 (Sep. 2011).
Extended Supplementary European Search Report dated Oct. 13, 2016 received in European Patent Application No. 14 76 0498.7.
International Search Report dated Mar. 25, 2014 received in International Application No. PCT/JP2014/054695.
Chinese Office Action dated Apr. 17, 2017 received in Chinese Patent Application No. 201480010964.2, together with an English-language translation.
U.S. Notice of Allowance dated Aug. 1, 2018 received in related U.S. Appl. No. 14/772,885.
U.S. non-Final Office Action dated Nov. 29, 2017 received in related U.S. Appl. No. 14/772,885.

*Primary Examiner* — Haidung D Nguyen
(74) *Attorney, Agent, or Firm* — Scully, Scott, Murphy & Presser, P.C.

(57) ABSTRACT

Provided are a $Ga_2O_3$-based single crystal substrate including a $Ga_2O_3$-based single crystal which has a high resistance while preventing a lowering of crystal quality and a production method therefor. According to one embodiment of the present invention, the production method includes growing the $Ga_2O_3$-based single crystal while adding a Fe to a $Ga_2O_3$-based raw material, the $Ga_2O_3$-based single crystal (5) including the Fe at a concentration higher than that of a donor impurity mixed in the $Ga_2O_3$-based raw material, and cutting out the $Ga_2O_3$-based single crystal substrate from the $Ga_2O_3$-based single crystal (5).

4 Claims, 1 Drawing Sheet

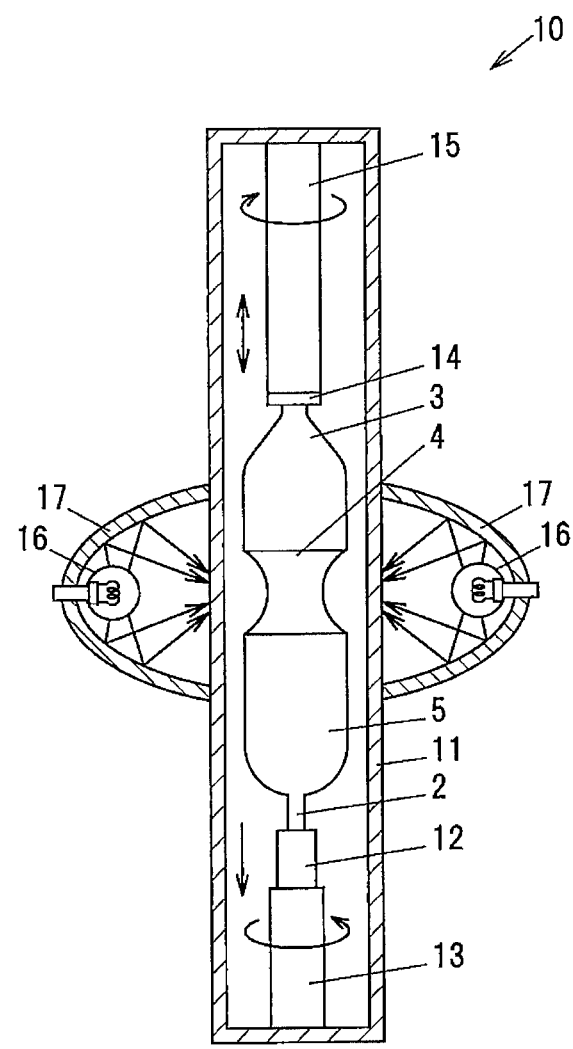

GA2O3-BASED SINGLE CRYSTAL SUBSTRATE, AND PRODUCTION METHOD THEREFOR

TECHNICAL FIELD

The invention relates to a $Ga_2O_3$-based single crystal substrate and a production method therefor.

BACKGROUND ART

A method is known in which Mg, Be or Zn is doped so as to increase the resistivity of a $Ga_2O_3$ single crystal (see e.g., PTL 1). PTL 1 states that the resistivity of the $Ga_2O_3$ single crystal can be increased by adding 0.01 mol % or 0.05 mol % of Mg in growing the $Ga_2O_3$ single crystal by a FZ (Floating Zone) method.

CITATION LIST

Patent Literature

[PTL 1]
JP-A-2011-102235

SUMMARY OF INVENTION

Technical Problem

As a raw material of $Ga_2O_3$ single crystal, $Ga_2O_3$ powder having a purity of not more than 99.999 mass % is widely used. It is technically possible to produce $Ga_2O_3$ powder having a higher purity but it is not realistic in terms of cost. $Ga_2O_3$ powder having a purity of not more than 99.999 mass % contains a trace amount of Si (donor impurity) as a residual impurity and a $Ga_2O_3$ single crystal grown using such $Ga_2O_3$ powder exhibits n-type conductivity. The concentration of Si included in the $Ga_2O_3$ powder has a distribution in the $Ga_2O_3$ single crystal. For example, the $Ga_2O_3$ single crystal grown using $Ga_2O_3$ powder having a purity of 99.999 mass % as a raw material has a Si concentration of about $5\times10^{17}$ $cm^{-3}$ at the most highly concentrated portion.

Therefore, in order to manufacture a high-resistivity $Ga_2O_3$ substrate, the $Ga_2O_3$ single crystal needs to be doped with an acceptor impurity at a concentration of at least $5\times10^{17}$ $cm^{-3}$ or more. If cheaper low-purity $Ga_2O_3$ powder is used as a raw material of $Ga_2O_3$ single crystal, it is necessary to dope the acceptor impurity at a higher concentration.

Generally, in doping a high-concentration impurity into a single crystal, a problem may arise that it is difficult to dope an impurity at a target concentration and that the crystal quality of the single crystal decreases due to the doping.

Thus, it is an object of the invention to provide a $Ga_2O_3$-based single crystal substrate comprising a $Ga_2O_3$-based single crystal that has a high resistance and while preventing a lowering of crystalline quality, as well as a production method therefor.

Solution to Problem

According to one embodiment of the invention, a production method for a $Ga_2O_3$-based single crystal substrate set forth in [1] to [5] below is provided so as to achieve the above object.

[1] A production method for a $Ga_2O_3$-based single crystal substrate, comprising:

a step of growing a $Ga_2O_3$-based single crystal while adding a Fe to a $Ga_2O_3$-based raw material, the $Ga_2O_3$-based single crystal comprising the Fe at a concentration higher than that of a donor impurity mixed in the $Ga_2O_3$-based raw material; and a step of cutting out the $Ga_2O_3$-based single crystal substrate from the $Ga_2O_3$-based single crystal.

[2] The production method for a $Ga_2O_3$-based single crystal substrate according to [1],
wherein the $Ga_2O_3$-based raw material has a purity of 99.999 mass %, and
wherein the $Ga_2O_3$-based single crystal grown comprises the Fe at a concentration of not less than $5\times10^{17}$ $cm^{-3}$.

[3] The production method for a $Ga_2O_3$-based single crystal substrate according to [1],
wherein the $Ga_2O_3$-based raw material has a purity of 99.99 mass %, and
wherein the $Ga_2O_3$-based single crystal grown comprises the Fe at a concentration of not less than $5\times10^{18}$ $cm^{-3}$.

[4] The production method for a $Ga_2O_3$-based single crystal substrate according to any one of [1] to [3], wherein the donor impurity comprises Si.

[5] The production method for a $Ga_2O_3$-based single crystal substrate according to any one of [1] to [3], wherein a principal surface of the $Ga_2O_3$ single crystal substrate has a size and a shape large enough to include a perfect circle of not less than 10 mm in diameter.

According to another embodiment of the invention, a $Ga_2O_3$-based single crystal substrate set forth in [6] to [8] below is provided so as to achieve the above object.

[6] A $Ga_2O_3$-based single crystal substrate, comprising a $Ga_2O_3$-based single crystal comprising a donor impurity and Fe.
wherein a concentration of the Fe is higher than a concentration of the donor impurity.

[7] The $Ga_2O_3$-based single crystal substrate according to [6], wherein the donor impurity comprises Si.

[8] The $Ga_2O_3$-based single crystal substrate according to [6] or [7], further comprising a principal surface that has a size and a shape large enough to include a perfect circle of not less than 10 mm in diameter.

Advantageous Effects of the Invention

According to the invention, a $Ga_2O_3$-based single crystal substrate can be provided which comprises a $Ga_2O_3$-based single crystal that has a high resistance while preventing a lowering of crystalline quality, as well as a production method therefor.

BRIEF DESCRIPTION OF DRAWINGS

FIG. 1 shows infrared-heating single crystal manufacturing equipment in an embodiment.

DESCRIPTION OF EMBODIMENTS

Embodiment ($Ga_2O_3$-Based Single Crystal Substrate)

A $Ga_2O_3$-based single crystal substrate in the present embodiment is formed of a $Ga_2O_3$-based single crystal which contains Fe as an acceptor impurity in addition to a donor impurity such as Si such that the Fe concentration is higher than the donor impurity concentration. Therefore, the $Ga_2O_3$-based single crystal substrate in the present embodiment has high electrical resistance.

The principal surface of the Ga$_2$O$_3$-based single crystal substrate preferably has a size and a shape which are enough to include a perfect circle of not less than 10 mm in diameter. This size of the Ga$_2$O$_3$-based single crystal substrate is suitable for mass production. Typical examples include a square of not less than 10 mm in each side, a perfect circle of not less than 10 mm in diameter, a rectangle having short sides of not less than 10 mm, and an ellipse having a minor axis of not less than 10 mm.

(Manufacture of Ga$_2$O$_3$-Based Single Crystal Substrate)

The Ga$_2$O$_3$-based single crystal substrate in the present embodiment is cut from a Ga$_2$O$_3$-based single crystal containing Fe which is doped as an acceptor impurity.

The Ga$_2$O$_3$-based single crystal in the present embodiment is a Ga$_2$O$_3$ single crystal, or a Ga$_2$O$_3$ single crystal doped with elements such as Al and In. It may be, e.g., a (Ga$_x$Al$_y$In$_{(1-x-y)}$)$_2$O$_3$ (0<x≤1, 0≤y≤1, 0<x+y≤1) single crystal which is a Ga$_2$O$_3$ single crystal doped with Al and In. The band gap is widened by adding Al and is narrowed by adding In.

By using Fe as an acceptor impurity, it is possible to dope a sufficient amount of acceptor while inhibiting a reduction in crystal quality, and thereby possible to grow a high-resistivity Ga$_2$O$_3$-based single crystal.

The method of growing a Ga$_2$O$_3$-based single crystal is not limited to a specific method and is, e.g., a FZ method, an EFG (Edge-defined Film-fed Growth) method or a CZ (Czochralski) method, etc. The reason why the method of growing a Ga$_2$O$_3$-based single crystal is not limited is considered that the effect of allowing a high-resistivity Ga$_2$O$_3$-based single crystal to grow while inhibiting a reduction in crystal quality is based on a solid solubility limit of Fe in a Ga$_2$O$_3$-based single crystal or the level of vapor pressure.

If a Ga$_2$O$_3$-based raw material having a purity of 99.999 mass % is used to grow the Ga$_2$O$_3$-based single crystal, Fe is added to the Ga$_2$O$_3$-based raw material such that the Fe concentration in the grown crystal is not less than $5 \times 10^{17}$ cm$^{-3}$. To achieve this, Fe is added in an amount of, e.g., not less than 0.001 mol %. Thereby, in the grown Ga$_2$O$_3$-based single crystal, the Fe concentration is higher than the concentration of Si which is derived from the Ga$_2$O$_3$-based raw material and functions as a donor impurity.

If a Ga$_2$O$_3$-based raw material having a purity of 99.99 mass % is used to grow the Ga$_2$O$_3$-based single crystal, Fe is added to the Ga$_2$O$_3$-based raw material such that the Fe concentration in the grown crystal is not less than $5 \times 10^{18}$ cm$^{-3}$. To achieve this, Fe is added in an amount of, e.g., not less than 0.01 mol %. Thereby, in the grown Ga$_2$O$_3$-based single crystal, the Fe concentration is higher than the concentration of Si which is derived from the Ga$_2$O$_3$-based raw material and functions as a donor impurity.

Here, when the Ga$_2$O$_3$-based single crystal is, e.g., a Ga$_2$O$_3$ single crystal, the Ga$_2$O$_3$-based raw material is Ga$_2$O$_3$ powder. Meanwhile, when the Ga$_2$O$_3$-based single crystal is a (Ga$_x$Al$_y$In$_{(1-x-y)}$)$_2$O$_3$ (0<x≤1, 0≤y≤1, 0<x+y≤1) single crystal, a mixture of Ga$_2$O$_3$ powder, Al$_2$O$_3$ powder and In$_2$O$_3$ powder is used.

The Ga$_2$O$_3$-based single crystal in the present embodiment is, e.g., a β-Ga$_2$O$_3$-based single crystal but may be a Ga$_2$O$_3$-based single crystal having another structure such as α-Ga$_2$O$_3$-based single crystal. Likewise, the Ga$_2$O$_3$-based single crystal substrate is, e.g., a β-Ga$_2$O$_3$-based single crystal substrate but may be a Ga$_2$O$_3$-based single crystal having another structure such as α-Ga$_2$O$_3$-based single crystal substrate.

Next, a method using FZ technique will be described as an example of the production method for a Ga$_2$O$_3$-based single crystal substrate.

FIG. 1 shows infrared-heating single crystal manufacturing equipment in the embodiment. The infrared-heating single crystal manufacturing equipment 10 is to grow a Ga$_2$O$_3$-based single crystal 5 using FZ technique, and has a quartz tube 11, a seed chuck 12 for holding a seed crystal 2 formed of a Ga$_2$O$_3$-based single crystal, a vertically-movable lower rotating shaft 13 to transmit rotation to the seed chuck 12, a raw material chuck 14 for holding a polycrystalline material 3 formed of a Ga$_2$O$_3$-based polycrystal, a vertically-movable upper rotating shaft 15 to transmit rotation to the raw material chuck 14, and an oval mirror 17 which houses halogen lamps 16 and collects light emitted from the halogen lamps 16 to a predetermined position of the polycrystalline material 3.

The quartz tube 11 houses the seed chuck 12, the lower rotating shaft 13, the raw material chuck 14, the upper rotating shaft 15, the seed crystal 2, the polycrystalline material 3 and the Ga$_2$O$_3$-based single crystal 5. A mixture gas of an oxygen gas and a nitrogen gas as an inert gas is supplied into the quartz tube 11 and is hermetically-sealed therein.

An upper edge of the seed crystal 2 is brought into contact with a lower edge of the polycrystalline material 3 by adjusting a vertical position of the upper rotating shaft 15, and in this state, a contact portion therebetween is heated and melted by collecting light of the halogen lamp 16 thereto. Then, the heated portion is moved by pulling the polycrystalline material 3 upward while appropriately rotating both or one of the seed crystal 2 and the polycrystalline material 3, thereby growing the Ga$_2$O$_3$-based single crystal 5 to which crystal information of the seed crystal 2 is transferred.

In FIG. 1 which shows the Ga$_2$O$_3$-based single crystal 5 in the middle of growth, the upper side of a melted portion 4 melted by heat is the polycrystalline material 3 and the lower side is the Ga$_2$O$_3$-based single crystal 5.

Next, a specific process of growing a Ga$_2$O$_3$ single crystal as the Ga$_2$O$_3$-based single crystal 5 using the infrared-heating single crystal manufacturing equipment 10 will be described.

Firstly, the seed crystal 2, which is formed of a β-Ga$_2$O$_3$ single crystal, and the polycrystalline material 3, which is formed of a Fe-containing β-Ga$_2$O$_3$ polycrystal produced by adding Fe to Ga$_2$O$_3$ powder having a purity of 99.999 mass %, are prepared separately. Here, it is possible to use pure Fe or Fe oxide as a raw material of Fe to be added to the Ga$_2$O$_3$ powder.

Next, in the quartz tube 11, the seed crystal 2 is bought into contact with the polycrystalline material 3 and the contact portion is heated such that both the seed crystal 2 and the polycrystalline material 3 are melted at the contact portion. Once the molten polycrystalline material 3 is crystallized together with the seed crystal 2, a Ga$_2$O$_3$ single crystal as the Ga$_2$O$_3$-based single crystal 5 containing Fe is produced above the seed crystal 2.

Here, the grown Ga$_2$O$_3$ single crystal as the Ga$_2$O$_3$-based single crystal 5 has a size such that a Ga$_2$O$_3$ single crystal substrate with a principal surface having a size and a shape enough to include a perfect circle of not less than 10 mm in diameter can be cut out.

Next, the Ga$_2$O$_3$ single crystal is processed by cutting, etc., thereby obtaining a high-resistivity Ga$_2$O$_3$ single crystal substrate.

When Fe was added in an amount of 0.01 mol % and 0.05 mol %, cracks were not generated on the $Ga_2O_3$ single crystal in both cases and a $Ga_2O_3$-based single crystal substrate having a square principal surface of not less than 10 mm in each side was obtained.

The Fe concentration in the obtained $Ga_2O_3$ single crystal was about $5\times10^{18}$ cm$^{-3}$ when adding 0.01 mol % of Fe and was about $1.5\times10^{19}$ cm$^{-3}$ when adding 0.05 mol % of Fe. Resistivity of the $Ga_2O_3$ single crystal substrate with 0.05 mol % of Fe was about $2\times10^{12}$ Ωcm.

For the purpose of comparison with the present embodiment, an element other than Fe was doped as an acceptor impurity into the $Ga_2O_3$ single crystal as Comparative Example. The experimental result is described below. The experimental conditions, except an acceptor impurity to be doped, were the same as those for the above-mentioned test using Fe for doping.

When the $Ga_2O_3$ single crystal was grown with Mg added at 0.05 mol %, cracks were easily generated on the grown crystal and it was not possible to cut out a $Ga_2O_3$ single crystal substrate having a square principal surface of not less than 10 mm in each side. It is considered that this is because the solid solubility limit of Mg in the $Ga_2O_3$ single crystal is lower than that of Fe.

Based on this result, another $Ga_2O_3$ single crystal was then grown with Mg added at 0.01 mol %. As a result, generation of cracks was reduced and a substrate having a suitable size for mass production was cut out but the substrate did not exhibit high resistivity. The Mg concentration in the substrate was about 2 to $5\times10^{17}$ cm$^{-3}$ and was less than the Si concentration which was about $5\times10^{17}$ cm$^{-3}$ in the high concentration region. From this result, it was found that it is necessary to use expensive $Ga_2O_3$ powder having a purity of not less than 990.9999% and having a lower Si concentration when Mg is doped to increase resistivity of the $Ga_2O_3$ single crystal without generation of cracks.

Meanwhile, when 0.05 mol % of Zn was added to the $Ga_2O_3$ powder for the purpose of doping Zn into the $Ga_2O_3$ single crystal, Zn was evaporated during calcination for making a rod-shaped polycrystalline material and the grown $Ga_2O_3$ single crystal did not exhibit high resistivity. The Zn concentration in the grown $Ga_2O_3$ single crystal analyzed by SIMS (secondary ion mass spectrometry) was below the lower detection limit (not more than $1\times10^{17}$ cm$^{-3}$). It was found from this result that it is difficult to dope Zn which has a high vapor pressure.

Effects of the Embodiment

According to the embodiment, use of Fe as an acceptor impurity allows a high-resistivity $Ga_2O_3$-based single crystal to be grown while inhibiting a reduction in crystal quality thereof, and a $Ga_2O_3$-based single crystal substrate having a suitable size for mass production is obtained from such a high-resistivity $Ga_2O_3$-based single crystal at low cost.

High-resistivity $Ga_2O_3$-based single crystal substrates can be used to manufacture, e.g., $Ga_2O_3$-based transistors and use of the $Ga_2O_3$-based single crystal substrate in the present embodiment thus allows $Ga_2O_3$-based transistors to be mass-produced. Since $Ga_2O_3$-based transistors are expected to have lower loss and higher breakdown voltage than GaN-based transistors or SiC-based transistors which have been being developed as next-generation power device materials, a global-scale significant energy-saving effect is expected if mass production of $Ga_2O_3$-based transistors is achieved.

Although the embodiment of the invention has been described above, the invention is not intended to be limited to the embodiment, and the various kinds of modifications can be implemented without departing from the gist of the invention.

For example, although Si is mentioned as an example of a donor impurity contained in the $Ga_2O_3$-based single crystal in the embodiment, the donor impurity is not limited to Si and may be a group IV element equivalent to Si. One electron is produced by substitution of a group IV element equivalent to Si for a Ga atom in the $Ga_2O_3$-based single crystal, meaning that the group IV element equivalent to Si functions as a donor impurity in the same manner as Si. Even in this case, the effects of the embodiment described above are obtained in the same manner as the case where Si is used as a donor impurity.

In addition, the invention according to claims is not to be limited to the embodiment. Further, it should be noted that all combinations of the features described in the embodiment are not necessary to solve the problem of the invention.

INDUSTRIAL APPLICABILITY

The invention provides a $Ga_2O_3$-based single crystal substrate comprising a $Ga_2O_3$-based single crystal that has a high resistance while preventing a lowering of crystalline quality, as well as a production method therefor.

REFERENCE SIGNS LIST

2 SEED CRYSTAL
3 POLYCRYSTALLINE MATERIAL
5 $Ga_2O_3$-BASED SINGLE CRYSTAL

The invention claimed is:
1. A $Ga_2O_3$-based single crystal substrate, consisting of:
   impurities of 0.001 mass % including Si and at least one element other than the Si;
   a $Ga_2O_3$-based single crystal of 99.999 mass %; and
   Fe of a predetermined amount that is not included in amounts of the impurities and the $Ga_2O_3$-based single crystal;
   wherein the Fe is higher in concentration than the Si, and
   wherein a concentration of the Fe ranges $5\times10^{17}$ cm$^{-3}$ to $1.5\times10^{19}$ cm$^{-3}$.
2. The $Ga_2O_3$-based single crystal substrate, according to claim 1:
   wherein a principal surface of the $Ga_2O_3$-based single crystal substrate has a size and a shape including a circle of not less than 10 mm in diameter.
3. A $Ga_2O_3$-based single crystal substrate, consisting of:
   impurities of 0.01 mass % including Si and at least one element other than the Si;
   a $Ga_2O_3$-based single crystal of 99.99 mass %; and
   Fe of a predetermined amount that is not included in amounts of the impurities and the $Ga_2O_3$-based single crystal;
   wherein the Fe is higher in concentration than the Si, and
   wherein a concentration of the Fe ranges $5\times10^{18}$ cm$^{-3}$ to $1.5\times10^{19}$ cm$^{-3}$.
4. The $Ga_2O_3$-based single crystal substrate, according to claim 3:
   wherein a principal surface of the $Ga_2O_3$-based single crystal substrate has a size and a shape including a circle of not less than 10 mm in diameter.

* * * * *